United States Patent
Shudo et al.

(10) Patent No.: US 12,077,637 B2
(45) Date of Patent: Sep. 3, 2024

(54) ADDITION-CURABLE LIQUID SILICONE RUBBER COMPOSITION FOR LED HEADLAMPS, AND LED HEADLAMP

(71) Applicant: SHIN-ETSU CHEMICAL CO., LTD., Tokyo (JP)

(72) Inventors: Shigeki Shudo, Annaka (JP); Mikio Iino, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 679 days.

(21) Appl. No.: 17/283,898

(22) PCT Filed: Sep. 19, 2019

(86) PCT No.: PCT/JP2019/036664
§ 371 (c)(1),
(2) Date: Apr. 8, 2021

(87) PCT Pub. No.: WO2020/080028
PCT Pub. Date: Apr. 23, 2020

(65) Prior Publication Data
US 2021/0355285 A1 Nov. 18, 2021

(30) Foreign Application Priority Data
Oct. 16, 2018 (JP) ................. 2018-194807

(51) Int. Cl.
| | | |
|---|---|---|
| C08L 83/04 | (2006.01) | |
| C08G 77/00 | (2006.01) | |
| C08G 77/08 | (2006.01) | |
| C08G 77/12 | (2006.01) | |
| C08G 77/20 | (2006.01) | |
| C08K 5/3492 | (2006.01) | |
| F21S 41/141 | (2018.01) | |
| F21S 45/10 | (2018.01) | |

(52) U.S. Cl.
CPC .............. *C08G 77/20* (2013.01); *C08G 77/08* (2013.01); *C08G 77/12* (2013.01); *C08G 77/70* (2013.01); *C08K 5/34924* (2013.01); *F21S 41/141* (2018.01); *F21S 45/10* (2018.01)

(58) Field of Classification Search
CPC ...................................... C08L 83/04
USPC ............................................ 528/15
See application file for complete search history.

(56) References Cited

U.S. PATENT DOCUMENTS

| | | | | |
|---|---|---|---|---|
| 5,082,886 | A * | 1/1992 | Jeram | C08L 83/04 528/31 |
| 5,455,313 | A | 10/1995 | Kurusu et al. | |
| 5,519,082 | A | 5/1996 | Yoshino | |
| 6,201,092 | B1 * | 3/2001 | Hara | C08L 83/04 528/33 |
| 2002/0161140 | A1 | 10/2002 | Yoneda et al. | |
| 2005/0256259 | A1 | 11/2005 | Goto et al. | |
| 2006/0159937 | A1 | 7/2006 | Miyoshi et al. | |
| 2006/0275617 | A1 | 12/2006 | Miyoshi et al. | |
| 2019/0225806 | A1 | 7/2019 | Muramatsu et al. | |

FOREIGN PATENT DOCUMENTS

| | | |
|---|---|---|
| JP | 7-41679 A | 2/1995 |
| JP | 7-331079 A | 12/1995 |
| JP | 2002-265787 A | 9/2002 |
| JP | 2003-59321 A | 2/2003 |
| JP | 2005-325211 A | 11/2005 |
| JP | 2006-202952 A | 8/2006 |
| JP | 2006-342200 A | 12/2006 |
| JP | 2008-101056 A | 5/2008 |
| JP | 2008-291124 A | 12/2008 |
| JP | 2016-84385 A | 5/2016 |
| JP | 2018-48214 A | 3/2018 |
| JP | 2019-189723 A | 10/2019 |
| WO | WO 2018/173945 A1 | 9/2018 |

OTHER PUBLICATIONS

International Search Report for PCT/JP2019/036664 mailed on Nov. 26, 2019.
Written Opinion of the International Searching Authority for PCT/JP2019/036664 mailed on Nov. 26, 2019.

* cited by examiner

*Primary Examiner* — Margaret G Moore
(74) *Attorney, Agent, or Firm* — Birch, Stewart, Kolasch & Birch, LLP

(57) ABSTRACT

An addition-curable liquid silicone rubber composition for LED headlamps, which contains:
- (A) (A-1) an alkenyl group-containing liquid organopolysiloxane, and
  (A-2) an alkenyl group-containing raw rubber-state organopolysiloxane;
- (B) a silicone resin which contains an alkenyl group, while being composed of a unit that is selected from among an $R^2{}_3SiO_{1/2}$ unit (M unit), an $SiO_{4/2}$ unit (Q unit), an $R^2{}_2SiO_{2/2}$ unit (D unit) and $R^2SiO_{3/2}$ unit (T unit);
- (C) an organohydrogen polysiloxane;
- (D) a platinum group metal catalyst; and
- (E) triallyl isocyanurate.

10 Claims, No Drawings

ADDITION-CURABLE LIQUID SILICONE RUBBER COMPOSITION FOR LED HEADLAMPS, AND LED HEADLAMP

TECHNICAL FIELD

This invention relates to a liquid silicone rubber composition based on organopolysiloxanes and adapted to cure through addition reaction and an LED headlamp. More particularly, it relates to an addition-curable liquid silicone rubber composition for LED headlamps, curing into a cured product which maintains high transparency and experiences minimal yellowing in a 150° C. long-term heat resistance test, and an LED headlamp encapsulated with a cured product of the composition.

BACKGROUND ART

Silicone base resins featuring high hardness and high transparency are regarded attractive for the purposes of weather resistance improvement and optical wave guidance for LED chips and various liquid crystal monitor screens. Among others, cured products of addition-curable liquid silicone rubber compositions which maintain high transparency because of totally zero silica content, do not detract from elasticity even at low temperature, and are relatively easy to mold by heat curing are used. Although highly transparent cured products of addition-curable liquid silicone rubber compositions having an initial hardness of 65 to 75 on Type A scale are used as the condenser lens in LED headlamps, they give rise to a yellowing problem in a 150° C. long-term heat resistance test.

The documents pertinent to the present invention are listed below.

PRIOR ART DOCUMENTS

Patent Documents

Patent Document 1: JP-A 2003-59321
Patent Document 2: JP-A 2002-265787
Patent Document 3: JP-A 2006-202952
Patent Document 4: JP-A 2006-342200
Patent Document 5: JP-A 2008-101056

SUMMARY OF INVENTION

Technical Problem

An object of the invention, which has been made under the above-mentioned circumstances, is to provide an addition-curable liquid silicone rubber composition for LED headlamps, curing into a cured product which maintains high transparency and experiences minimal yellowing in a 150° C. long-term heat resistance test, and an LED headlamp encapsulated with the composition.

Solution to Problem

Making extensive investigations to attain the above object, the inventors have found that when (E) a minor amount of triallyl isocyanurate is added to an addition-curable liquid silicone rubber composition comprising components (A) to (D) defined below, there is obtained an addition-curable liquid silicone rubber composition for LED headlamps, curing into a cured product which maintains high transparency and experiences minimal yellowing in a 150° C. long-term heat resistance test. The invention is predicated on this finding.

Accordingly, the invention provides an addition-curable liquid silicone rubber composition for LED headlamps and an LED headlamp as defined below.

1. An addition-curable liquid silicone rubber composition for LED headlamps, comprising:
    (A) (A-1) 100 parts by weight of an organopolysiloxane containing at least two silicon-bonded alkenyl groups per molecule, having an average degree of polymerization of less than 2,000, and being liquid at 25° C., and (A-2) 10 to 100 parts by weight of an organopolysiloxane containing at least two silicon-bonded alkenyl groups per molecule, having an average degree of polymerization of at least 2,000, and being gum-like at 25° C.,
    (B) 10 to 150 parts by weight of a silicone resin comprising units selected from among $R^2_3SiO_{1/2}$ units (M units), $SiO_{4/2}$ units (Q units), $R^2_2SiO_{2/2}$ units (D units), and $R^2SiO_{3/2}$ units (T units), wherein $R^2$ is a $C_1$-$C_6$ substituted or unsubstituted monovalent hydrocarbon group, the total of M and Q units is at least 80 mol % of the overall constitution units, and a molar ratio of M units to Q units is from 0.5 to 1.5, the silicone resin containing at least two alkenyl groups per molecule (overall constitution units),
    (C) an organohydrogenpolysiloxane containing at least two silicon-bonded hydrogen atoms (Si—H groups) per molecule, the content of Si—H groups being up to 0.0085 mol/g, in such an amount that the number of Si—H groups in component (C) is 1 to 3 per one of total silicon-bonded alkenyl groups in components (A) and (B),
    (D) a catalytic amount of a platinum group metal base catalyst, and
    (E) triallyl isocyanurate in an amount of 0.01 to less than 0.05 part by weight per 100 parts by weight of components (A), (B) and (C) combined.
2. The silicone rubber composition of 1 wherein component (A-2) has an alkenyl content in excess of 0.03 mmol/g.
3. The silicone rubber composition of 1 or 2 wherein component (A-1) has silicon-bonded alkenyl groups only at both ends of the molecular chain.
4. An LED headlamp encapsulated with a cured product of the silicone rubber composition of any one of 1 to 3, the cured product having a hardness of at least 65 as measured by Type A Durometer according to the method of JIS K 6249: 2003.

Advantageous Effects of Invention

According to the invention, there are provided an addition-curable liquid silicone rubber composition for LED headlamps, curing into a cured product which maintains high transparency and experiences minimal yellowing in the 150° C. long-term heat resistance test, and an LED headlamp encapsulated with the composition.

DESCRIPTION OF EMBODIMENTS

Now the invention is described in detail.
<Addition-Curable Liquid Silicone Rubber Composition>
The invention provides an addition-curable liquid silicone rubber composition for LED headlamps comprising the following components (A) to (E) and being liquid at room temperature (25° C.).
The components are described below in detail.

Component (A)

Component (A) consists of components (A-1) and (A-2) defined below.

Component (A-1) is an organopolysiloxane containing at least two silicon-bonded alkenyl groups per molecule, having an average degree of polymerization (DOP) of less than 2,000, and being liquid at 25° C. It is a well-known organopolysiloxane commonly used as a base polymer in liquid silicone rubber compositions of hydrosilylation cure type. Component (A-1) may be used alone or in admixture of two or more.

Component (A-1) or organopolysiloxane which is liquid at 25° C. preferably has an average DOP of up to 1,500, more preferably 150 to 1,500, even more preferably 150 to 1,000.

Also, component (A-1) preferably has a viscosity at 25° C. of 1 to 100 Pa·s, more preferably 5 to 100 Pa·s as measured by a rotational viscometer according to JIS K 6249: 2003.

Component (A-2) is an organopolysiloxane containing at least two silicon-bonded alkenyl groups per molecule, having an average DOP of at least 2,000, and being gum-like at 25° C. It is a well-known organopolysiloxane commonly used as a base polymer in millable type silicone rubber compounds. Component (A-2) may be used alone or in admixture of two or more.

Component (A-2) preferably has an average DOP of 2,000 to 100,000, more preferably 3,000 to 10,000.

A mixture of components (A-1) and (A-2) preferably has an average DOP of 3,500 to 8,000.

As used herein, the degree of polymerization (DOP) refers to a number average DOP, that is, average DOP as measured versus polystyrene standards by gel permeation chromatography (GPC) under the following conditions.

Measurement Conditions

Eluent: toluene
Flow rate: 1 mL/min
Detector: differential refractive index detector (RI)
Column: KF-805L×2 (by Shodex)
Column temperature: 25° C.
Sample dose: 30 μL (toluene solution of 0.2 wt % concentration)

Components (A-1) and (A-2) are both alkenyl-containing organopolysiloxanes, but different in molecular weight or DOP. They are generally represented by the average compositional formula (1) while they may be linear or branched.

$$R^1_a SiO_{(4-a)/2} \tag{1}$$

Herein $R^1$ is a $C_1$-$C_6$, especially $C_1$-$C_3$ substituted or unsubstituted monovalent hydrocarbon group. Exemplary are unsubstituted monovalent hydrocarbon groups including alkyl groups such as methyl, ethyl, propyl, butyl, pentyl and hexyl, alkenyl groups such as vinyl, allyl, butenyl, pentenyl and hexenyl, cycloalkyl groups such as cyclohexyl, cycloalkenyl groups such as cyclohexenyl, aryl groups such as phenyl, and substituted monovalent hydrocarbon groups including substituted forms of the foregoing monovalent hydrocarbon groups in which at least some hydrogen is substituted by halogen or cyano, typically substituted alkyl groups such as 3,3,3-trifluoropropyl and cyanomethyl.

Although a plurality of substituent groups may be different or identical, it is essential that at least two alkenyl groups be contained per molecule. The preferred alkenyl groups are vinyl groups, which may be attached at the end or a side chain of the molecular chain. Especially in component (A-1), one or two vinyl groups are preferably present at each of both ends of the molecular chain, and more preferably one vinyl group is present only at each of both ends of the molecular chain, totaling to two vinyl groups.

The subscript "a" is a positive number of 1.9 to 2.4, preferably 1.95 to 2.05.

Especially in component (A-1), a plurality of $R^1$ in average compositional formula (1) may be identical or different. It is preferred from the aspect of compatibility with other components in the addition-curable liquid silicone rubber composition that at least 80 mol % of $R^1$ in component (A-1) be methyl. This is because a cured product of the addition-curable liquid silicone rubber composition loses its transparency as the compatibility among components becomes poor. Also vinyl is preferred among alkenyl groups for the reason of compatibility with other components.

Also, component (A-1) or organopolysiloxane which is liquid at 25° C. preferably has an alkenyl content of 0.01 to 0.8 mmol/g, more preferably 0.02 to 0.6 mmol/g.

Component (A-2) or organopolysiloxane which is gum-like at 25° C. preferably has an alkenyl content in excess of 0.03 mmol/g, more preferably 0.04 to 15 mmol/g, even more preferably 0.04 to 1 mmol/g, most preferably 0.05 to 0.1 mmol/g. If the alkenyl content is 0.03 mmol/g or less, not only a greater variation of rubber hardness, but also a greater variation of rubber heat curing rate (or curability) may occur.

Preferred as components (A-1) and (A-2) are linear organopolysiloxanes having a backbone consisting of repeating diorganopolysiloxane units (D units) and capped with triorganosiloxy groups (M units) at both ends of the molecular chain, more preferably wherein silicon-bonded substituent groups other than alkenyl are methyl or phenyl. Examples include molecular chain both end trimethylsiloxy-capped dimethylsiloxane/methylvinylsiloxane copolymers, molecular chain both end trimethylsiloxy-capped methylvinylpolysiloxane, molecular chain both end trimethylsiloxy-capped dimethylsiloxane/methylvinylsiloxane/methylphenylsiloxane copolymers, molecular chain both end dimethylvinylsiloxy-capped dimethylpolysiloxane, molecular chain both end dimethylvinylsiloxy-capped methylvinylpolysiloxane, molecular chain both end dimethylvinylsiloxy-capped dimethylsiloxane/methylvinylsiloxane copolymers, molecular chain both end dimethylvinylsiloxy-capped dimethylsiloxane/methylvinylsiloxane/methylphenylsiloxane copolymers, molecular chain both end divinylmethylsiloxy-capped dimethylpolysiloxane, molecular chain both end divinylmethylsiloxy-capped dimethylsiloxane/methylvinylsiloxane copolymers, molecular chain both end trivinylsiloxy-capped dimethylpolysiloxane, molecular chain both end trivinylsiloxy-capped dimethylsiloxane/methylvinylsiloxane copolymers, and mixtures of two or more of the foregoing organopolysiloxanes.

Component (B)

Component (B) is a silicone resin comprising units selected from among $R^2_3 SiO_{1/2}$ units (M units), $SiO_{4/2}$ units (Q units), $R^2_2 SiO_{2/2}$ units (D units), and $R^2 SiO_{3/2}$ units (T units), wherein the total of M and Q units is at least 80 mol % of the overall constitution units, and a molar ratio of M units to Q units (i.e., M units/Q units) is from 0.5 to 1.5. $R^2$ in each unit is a $C_1$-$C_6$ monovalent hydrocarbon group. At least two alkenyl groups are contained per molecule (overall constitution units).

$R^2$ is a $C_1$-$C_6$, especially $C_1$-$C_3$ substituted or unsubstituted monovalent hydrocarbon group. Exemplary are unsubstituted monovalent hydrocarbon groups including alkyl groups such as methyl, ethyl, propyl, butyl, pentyl and hexyl, alkenyl groups such as vinyl, allyl, butenyl, pentenyl and hexenyl, cycloalkyl groups such as cyclohexyl, cycloalkenyl groups such as cyclohexenyl, aryl groups such as phenyl, and substituted monovalent hydrocarbon groups including substituted forms of the foregoing monovalent hydrocarbon groups in which at least some hydrogen is substituted by halogen or cyano, typically substituted alkyl groups such as 3,3,3-trifluoropropyl and cyanomethyl. Vinyl is preferred as the alkenyl group, and methyl or phenyl is preferred as the substituent group other than alkenyl.

Component (B) preferably has an alkenyl content of 0.01 to 5 mmol/g, more preferably 0.1 to 1 mmol/g.

In the silicone resin as component (B), $R^2{}_3SiO_{1/2}$ units (M units) and $SiO_{4/2}$ units (Q units) are essential among the four constitution units. For improving the hardness of a cured product of the addition-curable liquid silicone rubber composition, these two constitution units should account for at least 80 mol %, preferably at least 90 mol %, more preferably at least 95 mol %, most preferably 100 mol % of the overall constitution units.

Also, if the molar ratio of $R^2{}_3SiO_{1/2}$ units (M units) to $SiO_{4/2}$ units (Q units), i.e., M units/Q units is less than 0.5, the compatibility of component (B) with other components in the addition-curable liquid silicone rubber composition becomes poor. If the molar ratio is more than 1.5, a cured product of the addition-curable liquid silicone rubber composition becomes low in hardness. Therefore, the molar ratio of M units to Q units (i.e., M units/Q units) is from 0.5 to 1.5, preferably from 0.7 to 1.2.

It is noted that $R^2{}_2SiO_{2/2}$ units (D units) and $R^2SiO_{3/2}$ units (T units) may or may not be contained. When $R^2{}_2SiO_{2/2}$ units (D units) and/or $R^2SiO_{3/2}$ units (T units) are contained, the total content of these units is preferably up to 20 mol %, more preferably up to 10 mol %, even more preferably up to 5 mol % based on the overall constitution units. When both D units and T units are contained, the molar ratio of D units/T units is preferably from 0.01 to 0.15.

Examples of component (B) or silicone resin include copolymers consisting of vinyldimethylsiloxy-containing M units and Q units, copolymers consisting of vinyldimethylsiloxy-containing M units, trimethylsiloxy-containing M units, and Q units, copolymers consisting of vinyldimethylsiloxy-containing M units, dimethylsiloxane, and Q units, copolymers consisting of vinyldimethylsiloxy-containing M units, phenylsilsesquioxane, and Q units, copolymers consisting of vinyldimethylsiloxy-containing M units, dimethylsiloxane, phenylsilsesquioxane, and Q units, and copolymers consisting of trimethylsiloxy-containing M units, vinylmethylsiloxane, and Q units.

Components (A-1), (A-2) and (B) are blended in such a ratio that component (A-1) is 100 parts by weight, component (A-2) is 10 to 100 parts by weight, preferably 30 to 80 parts by weight, and component (B) is 10 to 150 parts by weight, preferably 20 to 120 parts by weight. In view of the viscosity of the composition, this range is appropriate to mold. If components (A-2) and (B) are outside the range, a cured product of the composition becomes brittle and cracks in the 150° C. long-term heat resistance test. Additionally, the composition is inappropriate to mold because the cured product becomes soft and sticky on the surface.

Component (C)

Component (C) is an organohydrogenpolysiloxane containing at least two silicon-bonded hydrogen atoms (Si—H groups) per molecule. Typically, it has the average compositional formula (2).

$$R^3{}_bH_cSiO_{(4-b-c)/2} \quad (2)$$

Herein $R^3$ is a $C_1$-$C_6$, especially $C_1$-$C_3$ substituted or unsubstituted monovalent hydrocarbon group. Exemplary are unsubstituted monovalent hydrocarbon groups including alkyl groups such as methyl, ethyl, propyl, butyl, pentyl and hexyl, cycloalkyl groups such as cyclohexyl, aryl groups such as phenyl, and substituted monovalent hydrocarbon groups including substituted forms of the foregoing monovalent hydrocarbon groups in which at least some hydrogen is substituted by halogen or cyano, typically substituted alkyl groups such as 3,3,3-trifluoropropyl and cyanomethyl. Preferably alkenyl groups are excluded.

The subscript b is a positive number of 0.7 to 2.1, c is a positive number of 0.18 to 1, and b+c is 0.88 to 3, preferably b is a positive number of 0.8 to 2, c is a positive number of 0.2 to 1, and b+c is 1 to 2.5.

The molecular structure of the organohydrogenpolysiloxane as component (C) may be linear, cyclic, branched or three-dimensional network. An organohydrogenpolysiloxane in which the number of silicon atoms per molecule (or DOP) is about 2 to about 300, especially about 4 to about 200 and which is liquid at 25° C. is preferably used. The silicon-bonded hydrogen atoms may be present at an end of the molecular chain or a side chain or both.

The content of Si—H groups in component (C) is up to 0.0085 mol/g, preferably 0.003 to 0.0085 mol/g. If the content of Si—H groups in component (C) exceeds 0.0085 mol/g, a cured product experiences a greater change of hardness and cracks in the 150° C. long-term heat resistance test.

Examples of the organohydrogenpolysiloxane as component (C) include both end trimethylsiloxy-capped methylhydrogenpolysiloxane, both end trimethylsiloxy-capped dimethylsiloxane/methylhydrogensiloxane copolymers, both end dimethylhydrogensiloxy-capped dimethylpolysiloxane, both end dimethylhydrogensiloxy-capped dimethylsiloxane/methylhydrogensiloxane copolymers, both end trimethylsiloxy-capped methylhydrogensiloxane/diphenylsiloxane copolymers, both end trimethylsiloxy-capped methylhydrogensiloxane/diphenylsiloxane/dimethylsiloxane copolymers, cyclic methylhydrogenpolysiloxane, cyclic methylhydrogensiloxane/dimethylsiloxane copolymers, cyclic methylhydrogensiloxane/diphenylsiloxane/dimethylsiloxane copolymers, copolymers consisting of $(CH_3)_2HSiO_{1/2}$ units and $SiO_{4/2}$ units, and copolymers consisting of $(CH_3)_2HSiO_{1/2}$ units, $SiO_{4/2}$ units, and $(C_6H_5)SiO_{3/2}$ units.

The amount of component (C) added is adjusted such that the number of silicon-bonded hydrogen atoms (Si—H groups) in component (C) may be 1 to 3, preferably 1.5 to 2.5 per one of total silicon-bonded alkenyl groups in components (A) and (B). Namely, the cured product becomes soft and sticky on the surface below the lower limit of the range whereas adhesion or bonding to a mold during molding can occur beyond the upper limit of the range.

Component (D)

Component (D) is a platinum group metal base catalyst, which may be any of well-known addition reaction catalysts.

Platinum, palladium and rhodium base catalysts are included, with platinum base catalysts being preferred. Exemplary platinum base catalysts include platinum black, platinic chloride, chloroplatinic acid, the reaction products of chloroplatinic acid with monohydric alcohols, the complexes of chloroplatinic acid with olefins, and platinum bisacetoacetate.

The amount of the platinum group metal base catalyst added may be a catalytic amount, specifically such an amount as to provide preferably 0.5 to 1,000 ppm, more preferably about 1 to about 200 ppm of platinum group metal based on component (A).

Component (E)

Component (E) is triallyl isocyanurate which is effective in minor amounts for reducing yellowing in the 150° C. long-term heat resistance test. The amount of component (E) added is from 0.01 part by weight to less than 0.05 part by weight, preferably from 0.02 to 0.04 part by weight per 100 parts by weight of components (A), (B) and (C) combined. Less than 0.01 part by weight of component (E) is insufficient to exert the yellowing reducing effect whereas 0.05 part by weight or more invites a great change of hardness between the initial and after 150° C./4,000 hours and affects rubber properties.

Other Components

The addition-curable liquid silicone rubber composition of the invention may contain an organopolysiloxane containing silicon-bonded alkenyl groups other than the alkenyl-containing organopolysiloxanes as components (A) and (B), an alkoxysilyl-containing alkoxysilane compound, a silane coupling agent, or a titanium or zirconium base condensation catalyst as crosslinking aid as long as the benefits of the invention are not impaired.

Also, addition reaction inhibitors may be added to insure a pot-life, for example, polyfunctional alkenyl compounds such as 1,3,5,7-tetramethyl-1,3,5,7-tetravinylcyclotetrasiloxane, and acetylene alcohol derivatives such as 1-ethynylcyclohexanol and 3,5-dimethyl-1-hexyn-3-ol. Further, inorganic fillers such as silica surface-treated with trimethylchlorosilane or octamethyltetracyclosiloxane may be added for improving the hardness or strength of the cured product. Still further, dyes, pigments, flame retardants, parting agents or the like can be added as long as the benefits of the invention are not impaired.

These optional components may be used alone or in admixture of two or more.

It is noted that the amount of the addition reaction inhibitor (component (F)), when added, is preferably 0.01 to 1 part by weight, more preferably 0.01 to 0.5 part by weight per 100 parts by weight of component (A).

[Method of Preparing Composition]

The addition-curable liquid silicone rubber composition of the invention may be prepared by mixing components (A) to (E) and optionally other components on a standard mixer, agitator or kneader such as kneader or planetary mixer until uniform.

[Curing Method]

The addition-curable liquid silicone rubber composition thus obtained may be cured into a cured product. The curing step may be performed under curing conditions as used for well-known addition reaction-curable silicone rubber compositions. For example, cure takes place at normal temperature (25° C.). If desired, the composition may be cured by heating, for example, by heating at 80 to 220° C., especially 120 to 200° C. for 3 seconds to 10 minutes, especially 5 seconds to 3 minutes.

[Molding Method]

For molding, any well-known methods of molding thermosetting resins may be used. In the case of press molding, for example, the addition-curable liquid silicone rubber composition may be cast between two liners and pressure vulcanized under predetermined mold conditions. In the case of a liquid injection molding machine of two liquid mixing type, a cured product of desired shape, for example, a molded part suited for optical application is obtained using an arbitrary mold. Two color molding with another resin is also possible. Further, compression molding and transfer molding are possible. In the case of stretch molding, the addition-curable liquid silicone rubber composition is fed between two continuous resin film liners, stretched to a predetermined thickness by rolls, and continuously supplied to a heating oven where it is hot air vulcanized under atmospheric pressure. After curing, the assembly is cooled and the liners are stripped, obtaining a transparent cured product in sheet form.

<LED Headlamp>

An LED headlamp is obtained by encapsulating an LED chip with a cured product of the addition-curable liquid silicone rubber composition according to the above-mentioned molding method. The cured product has a hardness of at least 65, preferably 65 to 85 as measured by Type A Durometer according to JIS K 6249: 2003. If the hardness of the cured product is less than 65, the molded product can be distorted due to deformation. The LED headlamp of the invention is useful on transportation vehicles including automobiles, trains and aircraft.

EXAMPLES

Examples and Comparative Examples are given below for illustrating the invention, but the invention is not limited thereto. In Examples, the amounts of components are parts by weight.

Examples 1 and 2 and Comparative Examples 1 and 2

Each of addition-curable liquid silicone rubber compositions was prepared by mixing (A-1) liquid alkenyl-containing organopolysiloxane, (A-2) gum-like alkenyl-containing organopolysiloxane, (B) silicone resin, (C) organohydrogenpolysiloxane, (D) platinum group metal base catalyst, (E) triallyl isocyanurate, and (F) addition reaction inhibitor in the amounts shown in Table 1 in a standard manner.

[Starting Materials]

(A-1) Alkenyl-containing organopolysiloxane which is liquid at 25° C.:
  both end dimethylvinylsiloxy-capped dimethylpolysiloxane
  average DOP: ~750
  viscosity: ~30 Pa·s
  number of vinyl groups per molecule: 2 (vinyl content: 0.036 mmol/g)

(A-2) Alkenyl-containing organopolysiloxane which is gum-like at 25° C.:
  both end dimethylvinylsiloxy-capped dimethylsiloxane/methylvinylsiloxane copolymer
  average DOP: ~8,000
  number of vinyl groups per molecule: 40 (vinyl content: 0.067 mmol/g)

(B) Silicone resin: copolymer consisting of $(CH_3)_3SiO_{1/2}$ (M) units,
  $(CH_2\!\!=\!\!CH)(CH_3)_2SiO_{1/2}$ (M) units, and $SiO_{4/2}$ (Q) units
  number of vinyl groups per molecule: 4.0 (vinyl content: 0.84 mmol/g)
  molar ratio of M units to Q units in molecule (M units/Q units): 0.85
(C) Organohydrogenpolysiloxane:
(C-1) Both end trimethylsiloxy-capped methylhydrogenpolysiloxane
  number of Si—H groups per molecule: 20 (Si—H content: 0.0073 mol/g)
(C-2) Both end trimethylsiloxy-capped methylhydrogenpolysiloxane
  number of Si—H groups per molecule: 50 (Si—H content: 0.0081 mol/g)
(D) Platinum group metal base catalyst: platinum catalyst, Pt concentration 1 wt %
(E) Triallyl isocyanurate
(F) Addition reaction inhibitor: 1-ethynylcyclohexanol

[Curing/Molding]

A polyethylene terephthalate (PET) liner and a frame of 2.2 mm thick were laid on a press plate. The addition-curable liquid silicone rubber composition was cast into the frame, after which another PET liner and another press plate were laid thereon. The composition was press molded at 120° C. for 10 minutes. The composition was taken out together with the two PET liners and cooled. The PET liners were stripped off, leaving a transparent silicone rubber film of ~2 mm thick. The transparent silicone rubber film was heat cured in a hot air circulating dryer at 150° C. for 1 hour.

[Evaluation]

Each example was evaluated for the following physical properties, with the results shown in Table 1.

Cured product hardness: Hardness was measured at the initial and after 150° C./4,000 hours by Type A Durometer according to JIS K 6249: 2003 (three plies of 2 mm sheet).
  Transparency: The overall light transmittance (%) and haze (%) of the 2-mm sheet were measured at the initial and after 150° C./4,000 hours.
  Yellowing: The b* value (yellowness index) of the 2-mm sheet was measured by a colorimeter at the initial and after 150° C./4,000 hours.

TABLE 1

| | Parts by weight | | Example 1 | Example 2 | Comparative Example 1 | Comparative Example 2 |
|---|---|---|---|---|---|---|
| (A) | (A-1) liquid alkenyl-containing polysiloxane | | 80.0 | 80.0 | 80.0 | 80.0 |
| | (A-2) gum-like alkenyl-containing polysiloxane | | 50.0 | 50.0 | 50.0 | 50.0 |
| (B) | silicone resin | | 80.0 | 80.0 | 80.0 | 80.0 |
| (C) | (C-1) organohydrogenpolysiloxane | | 20.1 | — | 20.1 | — |
| | (C-2) organohydrogenpolysiloxane | | — | 18.1 | — | 18.1 |
| SiH group/SiVi group ratio | | | 2.0 | 2.0 | 2.0 | 2.0 |
| (D) | addition reaction catalyst | | 0.1 | 0.1 | 0.1 | 0.1 |
| (E) | triallyl isocyanurate | | 0.10 | 0.10 | — | — |
| | value in parentheses is a proportion | | (0.04) | (0.04) | | |
| | per 100 pbw of components (A) to (C) | | | | | |
| (F) | addition reaction inhibitor | | 0.04 | 0.04 | 0.04 | 0.04 |
| Hardness (Type A) | | initial | 67 | 70 | 67 | 70 |
| | | after 150° C./4,000 hr | 74 | 77 | 74 | 77 |
| Transparency | Overall light transmittance (%) | initial | 94.7 | 94.7 | 94.7 | 94.7 |
| | | after 150° C./4,000 hr | 94.6 | 94.6 | 94.6 | 94.6 |
| | Haze (%) | initial | 1.5 | 1.6 | 1.5 | 1.6 |
| | | after 150° C./4,000 hr | 2.0 | 2.0 | 2.0 | 2.0 |
| b* value (yellowness index) | | initial | 0.19 | 0.19 | 0.19 | 0.19 |
| | | after 150° C./4,000 hr | 0.27 | 0.27 | 0.40 | 0.40 |

Note:
Si—H group/Si-Vi group ratio is the number of silicon-bonded hydrogen atoms in component (C) per one of total silicon-bonded alkenyl groups in components (A) and (B)

The invention claimed is:

1. An addition-curable liquid silicone rubber composition for LED headlamps, comprising:
   (A) (A-1) 100 parts by weight of an organopolysiloxane containing at least two silicon-bonded alkenyl groups per molecule, having an average degree of polymerization of less than 2,000, and being liquid at 25° C., and (A-2) 10 to 100 parts by weight of an organopolysiloxane containing at least two silicon-bonded alkenyl groups per molecule, having an average degree of polymerization of at least 2,000, and being gum at 25° C.,
   (B) 10 to 150 parts by weight of a silicone resin comprising units selected from among $R^2_3SiO_{1/2}$ units (M units), $SiO_{4/2}$ units (Q units), $R^2_2SiO_{2/2}$ units (D units), and $R^2SiO_{3/2}$ units (T units), wherein $R^2$ is a $C_1$-$C_6$ substituted or unsubstituted monovalent hydrocarbon group, the total of M and Q units is at least 80 mol % of the overall constitution units, and a molar ratio of M units to Q units is from 0.5 to 1.5, the silicone resin containing at least two alkenyl groups per molecule (overall constitution units),
   (C) an organohydrogenpolysiloxane containing at least two silicon-bonded hydrogen atoms (Si—H groups) per molecule, the content of Si—H groups being up to 0.0085 mol/g, in such an amount that the number of Si—H groups in component (C) is 1 to 3 per one of total silicon-bonded alkenyl groups in components (A) and (B),
   (D) a catalytic amount of a platinum group metal base catalyst, and
   (E) triallyl isocyanurate in an amount of 0.01 to less than 0.05 part by weight per 100 parts by weight of components (A), (B) and (C) combined.

2. The silicone rubber composition of claim 1 wherein component (A-2) has an alkenyl content in excess of 0.03 mmol/g.

3. The silicone rubber composition of claim 1 wherein component (A-1) has silicon-bonded alkenyl groups only at both ends of the molecular chain.

4. An LED headlamp encapsulated with a cured product of the silicone rubber composition of claim 1, the cured product having a hardness of at least 65 as measured by Type A Durometer according to the method of JIS K 6249: 2003.

5. The silicone rubber composition of claim 1 wherein component (A-1) has an alkenyl content of 0.01 to 0.8 mmol/g.

6. The silicone rubber composition of claim 1 wherein component (A-2) has silicon-bonded alkenyl groups only at both ends of the molecular chain.

7. The silicone rubber composition of claim 1 wherein component (B) has an alkenyl content of 0.01 to 5 mmol/g.

8. The silicone rubber composition of claim 1 which does not contain an inorganic filler.

9. An addition-curable liquid silicone rubber composition for LED headlamps, consisting of:
   (A) (A-1) 100 parts by weight of an organopolysiloxane containing at least two silicon-bonded alkenyl groups per molecule, having an average degree of polymerization of less than 2,000, and being liquid at 25° C., and (A-2) 10 to 100 parts by weight of an organopolysiloxane containing at least two silicon-bonded alkenyl groups per molecule, having an average degree of polymerization of at least 2,000, and being gum at 25° C.,
   (B) 10 to 150 parts by weight of a silicone resin comprising units selected from among $R^2_3SiO_{1/2}$ units (M units), $SiO_{4/2}$ units (Q units), $R^2_2SiO_{2/2}$ units (D units), and $R^2SiO_{3/2}$ units (T units), wherein $R^2$ is a $C_1$-$C_6$ substituted or unsubstituted monovalent hydrocarbon group, the total of M and Q units is at least 80 mol % of the overall constitution units, and a molar ratio of M units to Q units is from 0.5 to 1.5, the silicone resin containing at least two alkenyl groups per molecule (overall constitution units),
   (C) an organohydrogenpolysiloxane containing at least two silicon-bonded hydrogen atoms (Si—H groups) per molecule, the content of Si—H groups being up to 0.0085 mol/g, in such an amount that the number of Si—H groups in component (C) is 1 to 3 per one of total silicon-bonded alkenyl groups in components (A) and (B),
   (D) a catalytic amount of a platinum group metal base catalyst, and
   (E) triallyl isocyanurate in an amount of 0.01 to less than 0.05 part by weight per 100 parts by weight of components (A), (B) and (C) combined; and
   optionally one or more ingredients selected from dyes, pigments, flame retardants, parting agents.

10. An LED headlamp encapsulated with a cured product of the silicone rubber composition of claim 9, the cured product having a hardness of at least 65 as measured by Type A Durometer according to the method of JIS K 6249: 2003.

* * * * *